United States Patent
Chen et al.

(10) Patent No.: US 7,679,163 B2
(45) Date of Patent: Mar. 16, 2010

(54) PHASE-CHANGE MEMORY ELEMENT

(75) Inventors: Frederick T Chen, Hsinchu (TW); Ming-Jinn Tsai, Hsinchu (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 300 days.

(21) Appl. No.: 11/748,440

(22) Filed: May 14, 2007

(65) Prior Publication Data

US 2008/0283814 A1 Nov. 20, 2008

(51) Int. Cl.
*H01L 29/04* (2006.01)
*H01L 29/00* (2006.01)

(52) U.S. Cl. ............................... 257/537; 257/3; 257/4; 257/530

(58) Field of Classification Search ..................... 257/3, 257/4, 530, 537, E31.029
See application file for complete search history.

(56) References Cited

U.S. PATENT DOCUMENTS

| | | | |
|---|---|---|---|
| 5,933,365 A | 8/1999 | Klersy et al. | |
| 7,023,014 B2 * | 4/2006 | Morimoto et al. | 257/42 |
| 7,214,958 B2 * | 5/2007 | Happ | 257/4 |
| 7,417,245 B2 * | 8/2008 | Happ et al. | 257/2 |
| 7,476,587 B2 * | 1/2009 | Lung | 438/258 |
| 2003/0062595 A1 * | 4/2003 | Anthony | 257/530 |
| 2008/0138929 A1 * | 6/2008 | Lung | 438/102 |
| 2008/0138930 A1 * | 6/2008 | Lung | 438/102 |
| 2008/0303014 A1 * | 12/2008 | Goux et al. | 257/3 |
| 2009/0098716 A1 * | 4/2009 | Lung | 438/482 |
| 2009/0104771 A1 * | 4/2009 | Lung | 438/666 |

* cited by examiner

*Primary Examiner*—Ngan Ngo
(74) *Attorney, Agent, or Firm*—Quintero Law Office

(57) ABSTRACT

A phase-change memory element for reducing heat loss is disclosed. The phase-change memory element comprises a composite layer, wherein the composite layer comprises a dielectric material and a low thermal conductivity material. A via hole is formed within the composite layer. A phase-change material occupies at least one portion of the via hole. The composite layer comprises alternating layers or a mixture of the dielectric material and the low thermal conductivity material.

21 Claims, 9 Drawing Sheets

PHASE-CHANGE MEMORY ELEMENT

BACKGROUND OF THE INVENTION

1. Field of the Invention

The invention relates to a memory element, and more particularly to a phase-change memory element.

2. Description of the Related Art

Phase-change memory is a scalable, high speed, and non-volatile memory technology. It is targeted typically for mobile devices which require low power consumption. A phase-change memory cell must therefore provide low programming current, avoidance of high voltages, smaller cell size, faster phase transformation speed, and low cost. These requirements are difficult to meet given the current state of the art.

The most straightforward way to reduce the programming current is to reduce the heating area. A benefit of this strategy is simultaneous reduction of cell size. However, reducing the area results in a higher cell resistance, which increases the required driving voltage. All other considerations being the same, the amount of Joule heating is conserved, meaning the operating voltage is inversely proportional to the programming current. This is clearly not desirable. Reducing heating area does not necessarily improve other performance features. Phase transformation speed requires good thermal uniformity within the active region of the cell.

In reality, cooling becomes significant for smaller structures, and loss to environment becomes more important with increased surface/volume ratio. As a result, temperature uniformity is degraded. In addition, the required current density must increase as heating area is reduced. This poses an electromigration concern for reliability. Hence, it is important to not only reduce the current, but also required heating. Since the amount of Joule heating input is reduced, heat loss to the environment must be reduced even further.

The heating loss is proportional to the thermal conductivity of the surrounding dielectric material. As a reference, the thermal conductivity of a commonly used phase-change chalcogenide, $Ge_2Sb_2Te_5$, is experimentally measured to have a range of values, averaging around a value of 0.3 W/m-K. The low conductivity is due to both low electron density and vacancies in the microstructure which enhance phonon scattering. Since it is the active material, it obviously cannot serve as the surrounding dielectric. Silicon nitride and silicon oxide are stable in contact with the chalcogenide. However, their thermal conductivities approach and sometimes exceed 1 W/m-K, which prohibits scaling down the programming current beyond the current state of the art.

One solution uses a mixture of the low thermal conductivity chalcogenide material with a stable higher thermal conductivity dielectric, such that the effective thermal conductivity of the mixture approaches that of the chalcogenide.

U.S. Pat. No. 5,933,365 "Memory element with energy control mechanism" discloses the use of thermal isolation layers which at least partially encapsulate the phase-change material. However, the selection of candidate materials far exceeds the range of materials available for state-of-the-art memory cell fabrication, and do not reflect the currently known thermal conductivities of such materials.

Therefore, it is necessary to develop a phase-change memory to solve the previously described problems.

BRIEF SUMMARY OF THE INVENTION

An exemplary embodiment a phase-change memory element comprises a composite layer comprising a dielectric material and a low thermal conductivity material, a via hole within the composite layer, and a phase-change material occupying at least one portion of the via hole.

According to another embodiment of the invention, a phase-change memory element comprises a substrate, an electrode formed on the substrate, a composite layer formed on the substrate comprising a dielectric material and a low thermal conductivity material, a via hole passing through the composite layer, and a phase-change material occupying at least one portion of the via hole and contacting the electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

First Embodiment

Figure 1A:
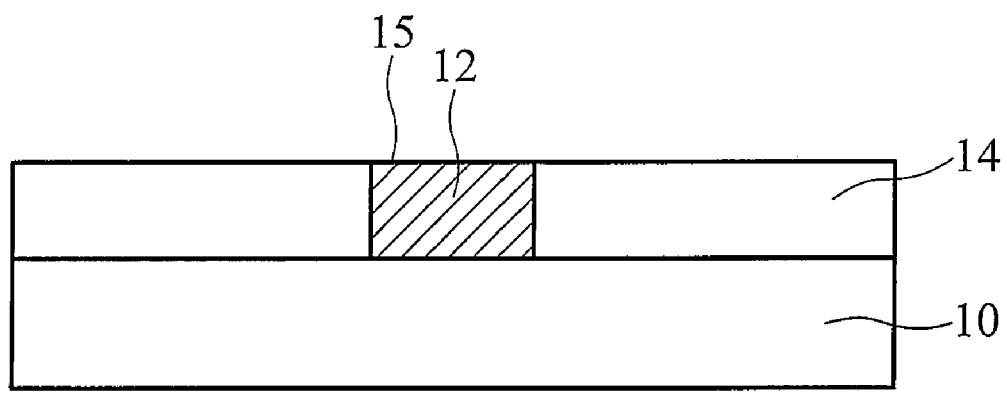
FIGS. 1a-1e are cross sections of a method of fabricating a phase-change memory element according to a first embodiment of the invention.

First, referring to FIG. 1a, a substrate 10 with a bottom electrode 12 formed thereon is provided, and an isolation layer 14 surrounds the bottom electrode 12 exposing the top surface 15 of the bottom electrode 12. Particularly, the substrate 10 can be a substrate employed in a semiconductor process, such as silicon substrate. The substrate 10 can be a substrate comprising a complementary metal oxide semiconductor (CMOS) circuit, isolation structure, diode, or capacitor. The accompanying drawings show the substrate 10 in a plain rectangle in order to simplify the illustration. Suitable material for the bottom electrode 12, for example, is Al, W, Mo, TiN, or TiW. The isolation layer 14 can be a silicon-containing compound, such as silicon nitride or silicon oxide.

Figure 1B:
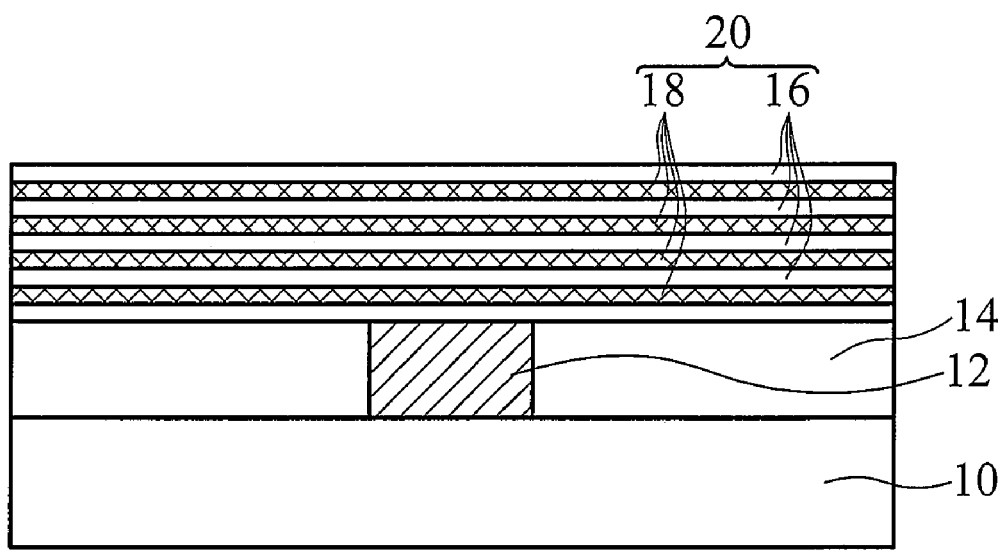

Next, referring to FIG. 1b, a composite layer 20 is formed on the bottom electrode 12 and the isolation layer 14, wherein the composite layer 20 comprises alternating layers of the dielectric material layers 16 and the low thermal conductivity material layers 18. At least one layer of all the dielectric material layers 16 and the low thermal conductivity material layers are provided. The thickness of the dielectric material layers 16, and of the low thermal conductivity material layers 18 can be at least 3 nm. The low thermal conductivity material 18 has a thermal conductivity of 0.1 W/m-K to 1 W/m-K, such as 0.2~0.3 W/m-K, and can be phase-change material, nitrogen-doped phase-change material, or oxygen-doped phase-change material, such as $Ge_2Sb_2Te_5$. The dielectric material 16 comprises silicon oxide, silicon nitride, or combinations thereof.

Figure 1C:
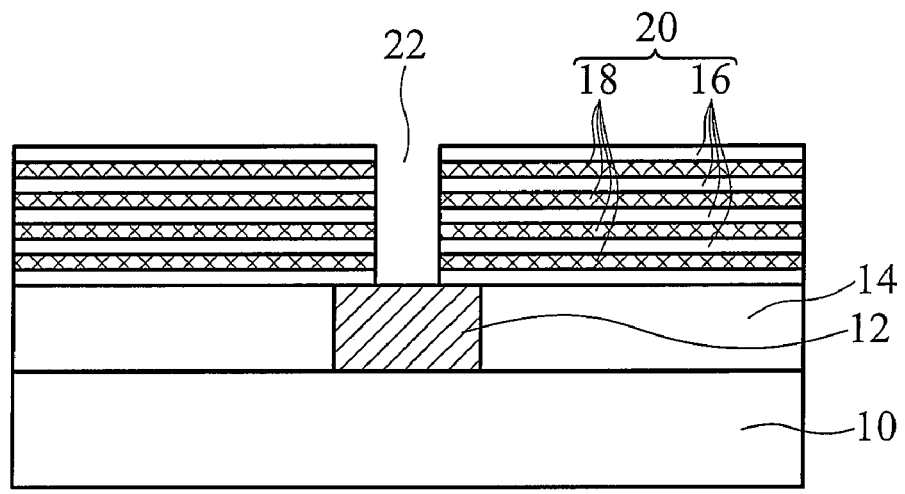

Next, referring to FIG. 1c, the composite layer 20 is patterned to form a via hole 22 passing therethrough by photolithography and etching, exposing the top surface 15 of the bottom electrode 12. The composite layer 20, for example, is dry etched.

Figure 1D:
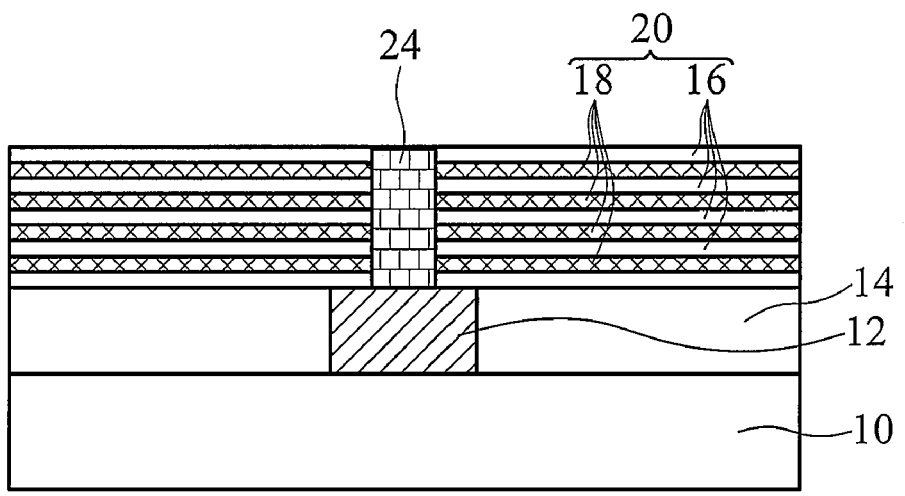

Next, referring to FIG. 1d, a phase-change material layer 24 is deposited to fill the via hole 22. The phase-change material layer 24 can comprise In, Ge, Sb, Te or combinations thereof, such as GeSbTe or InGeSbTe.

Figure 1E:
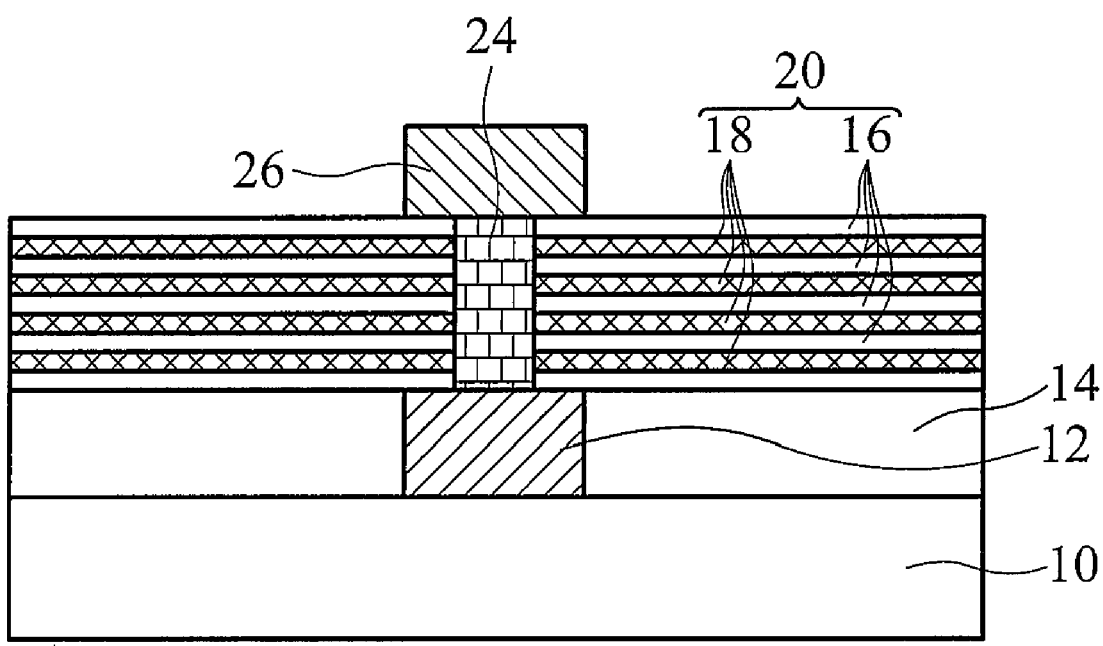

Finally, referring to FIG. 1e, a top electrode 26 is formed on the composite layer 20 and contacts the phase-change material layer 24. Suitable material of the top electrode 26, for example, can be TaN, W, TiN, or TiW.

Second Embodiment

Figure 2A:
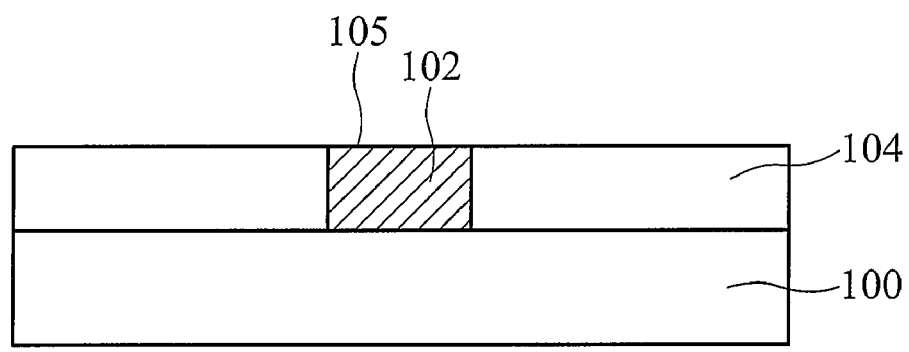
FIGS. 2a-2e are cross sections of a method of fabricating a phase-change memory element according to a second embodiment of the invention.

First, referring to FIG. 2a, a substrate 100 with a bottom electrode 102 formed thereon is provided, and an isolation layer 104 surrounds the bottom electrode 102 exposing the top surface 105 of the bottom electrode 102. Particularly, the substrate 100 can be a substrate employed in a semiconductor process, such as silicon substrate. The substrate 100 can be a substrate comprising a complementary metal oxide semiconductor (CMOS) circuit, isolation structure, diode, or capacitor. The accompanying drawings show the substrate 100 in a plain rectangle in order to simplify the illustration. Suitable material for the bottom electrode 102, for example, is Al, W, Mo, TiN, or TiW. The isolation layer 104 can be a silicon-containing compound, such as silicon nitride or silicon oxide.

Figure 2B:
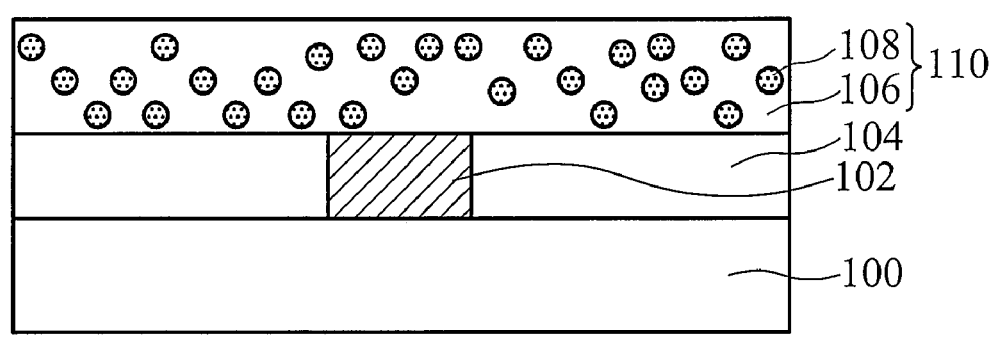

Next, referring to FIG. 2b, a composite layer 110 is formed on the bottom electrode 102 and the isolation layer 104, wherein the composite layer 110 consists of a mixture of the dielectric material 106 and the low thermal conductivity material 108. Particularly, the weight ratio of the composite layer between the dielectric material and the low thermal conductivity material is 1:10~1:1. The low thermal conductivity material 108 has a thermal conductivity of 0.1 W/m-K to 1 W/m-K, such as 0.2~0.3 W/m-K, and can be phase-change material, nitrogen-doped phase-change material, or oxygen-doped phase-change material, such as $Ge_2Sb_2Te_5$. The dielectric material 106 comprises silicone oxide, silicone nitride, or combinations thereof.

Figure 2C:
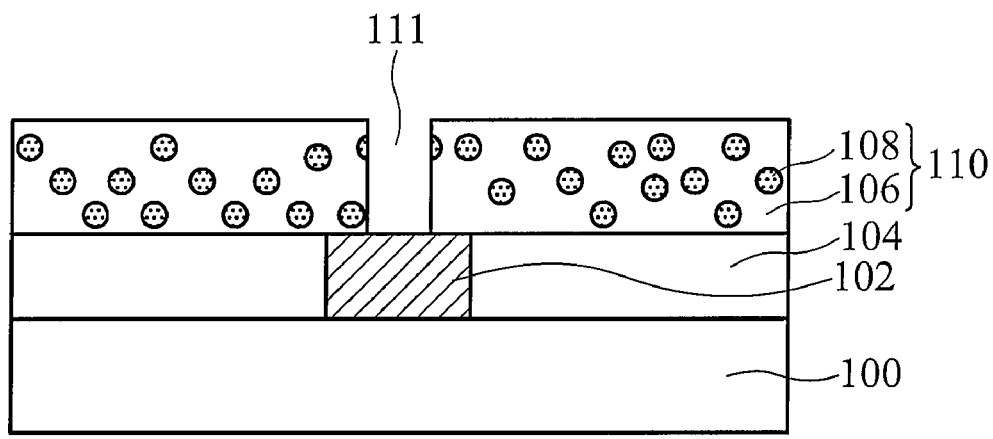

Next, referring to FIG. 2c, the composite layer 110 is etched to form a via hole 111 passing therethrough by photolithography, exposing the top surface 105 of the bottom electrode 102. Composite layer 110, for example, is dry etched.

Figure 2D:
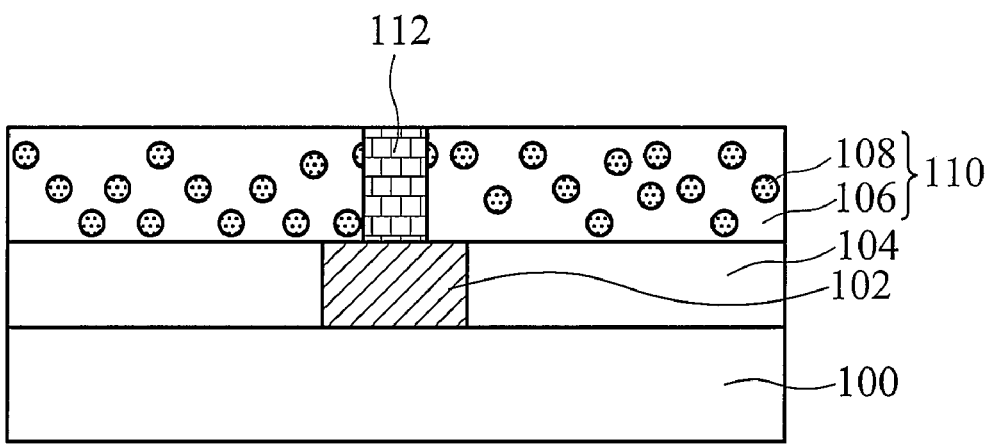

Next, referring to FIG. 2d, a phase-change material layer 112 is deposited to fill the via hole 1 111. The phase-change layer 112 can comprise In, Ge, Sb, Te or combinations thereof, such as GeSbTe or InGeSbTe.

Figure 2E:
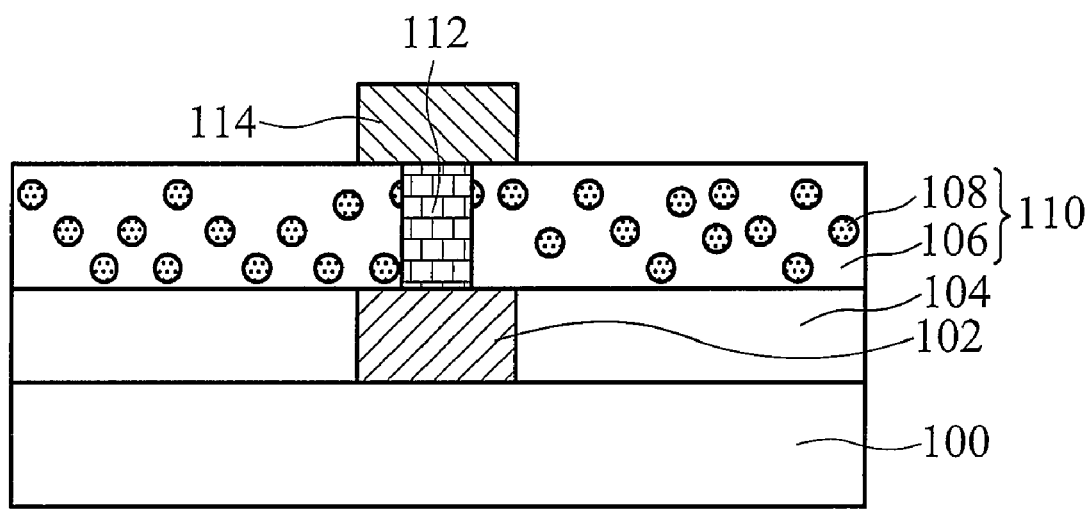

Finally, referring to FIG. 2e, a top electrode 114 is formed on the composite layer 110 and contacts the phase-change material layer 112. Suitable material of the top electrode 114, for example, is TaN, W, TiN, or TiW.

Third Embodiment

Figure 3A:
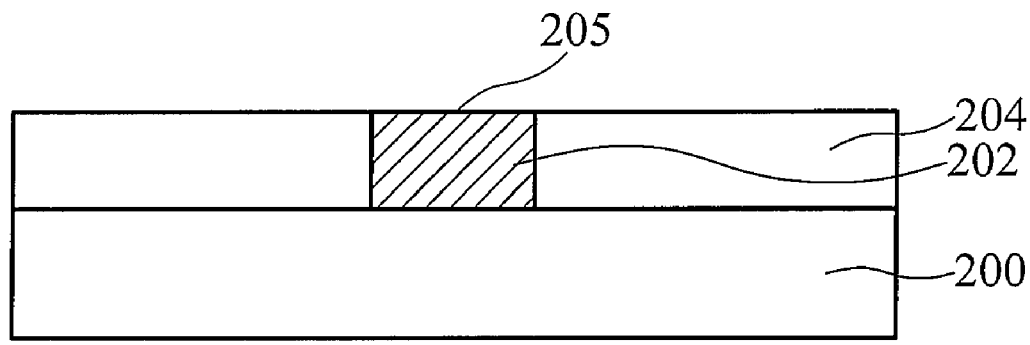
FIGS. 3a-3d are cross sections of a method of fabricating a phase-change memory element according to a third embodiment of the invention.

First, referring to FIG. 3a, a substrate 200 with a bottom electrode 202 formed thereon is provided, and an isolation layer 204 surrounds the bottom electrode 202 exposing the top surface 205 of the bottom electrode 202. Particularly, the substrate 200 can be a substrate employed in a semiconductor process, such as silicon substrate. The substrate 200 can be a substrate comprising a complementary metal oxide semiconductor (CMOS) circuit, isolation structure, diode, or capacitor. The accompanying drawings show the substrate 200 in a plain rectangle in order to simplify the illustration. Suitable material for the bottom electrode 202, for example, is Al, W, Mo, TiN, or TiW. The isolation layer 204 can be a silicon-containing compound, such as silicon nitride or silicon oxide.

Figure 3B:
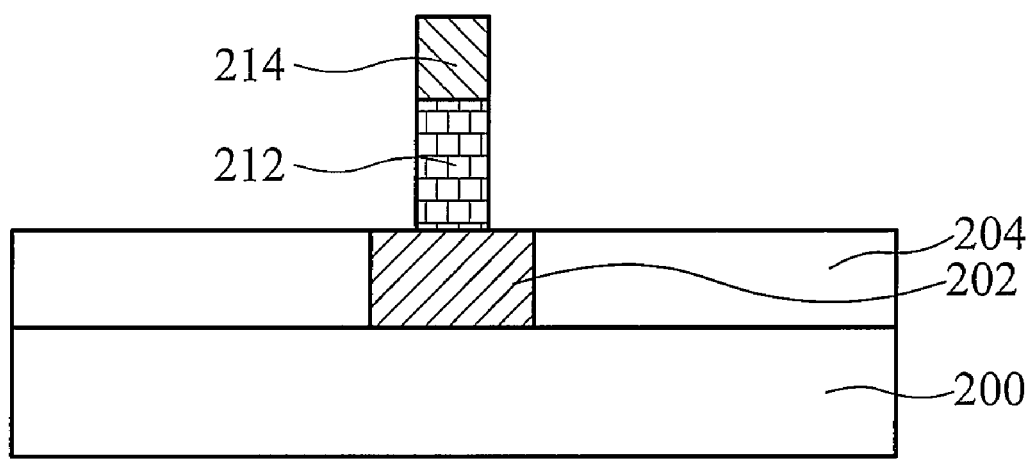

Next, referring to FIG. 3b, a phase-change material layer 212 is formed on the bottom electrode 202 and electrically connected therewith, and a top electrode 214 is formed on the phase-change material layer 212 and contacts the phase-change material layer 212. The phase-change layer 212 can comprise In, Ge, Sb, Te or combinations thereof, such as GeSbTe or InGeSbTe. Suitable material of the top electrode 214, for example, is TaN, W, TiN, or TiW. Formation of the phase-change material layer 212 and top electrode 214 can comprise: sequentially forming a phase-change material layer and a conductive layer on the substrate 200, and patterning the phase-change material layer and the conductive layer by photolithography and etching to form the phase-change material layer 212 and top electrode 214 patterns.

Figure 3C:
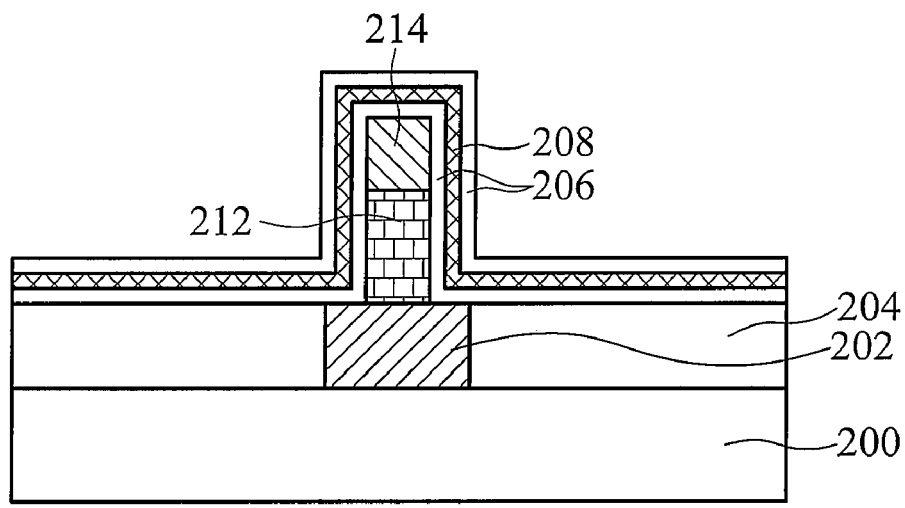

Next, referring to FIG. 3c, dielectric material layers 206 and low thermal conductivity material layers 208 are alternately formed on the substrate 200. Particularly, the weight ratio of the composite layer between the dielectric material and the low thermal conductivity material is 1:10~1:1. The low thermal conductivity material 208 has a thermal conductivity of 0.1 W/m-K to 1 W/m-K, such as 0.2~0.3 W/m-K, and can be phase-change material, nitrogen-doped phase-change material, or oxygen-doped phase-change material, such as $Ge_2Sb_2Te_5$. The dielectric material 206 comprises silicon oxide, silicon nitride, or combinations thereof.

Figure 3D:
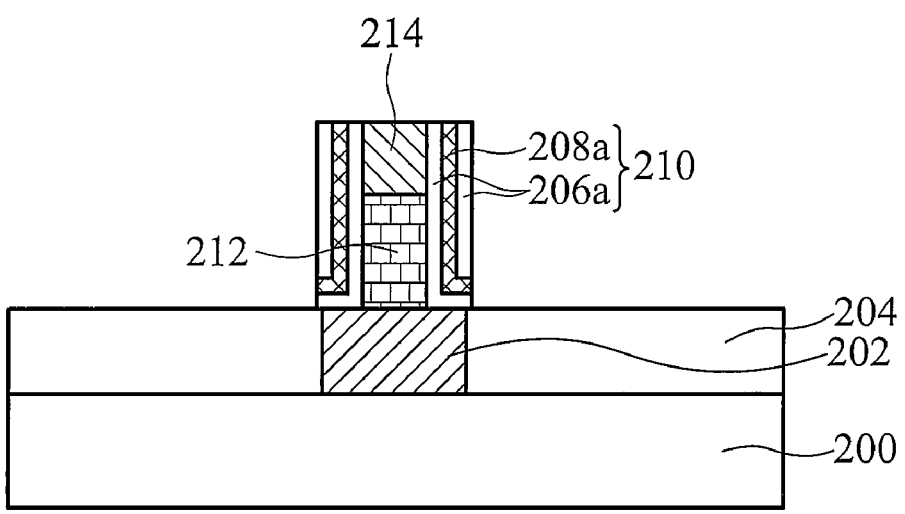
Figure 4:
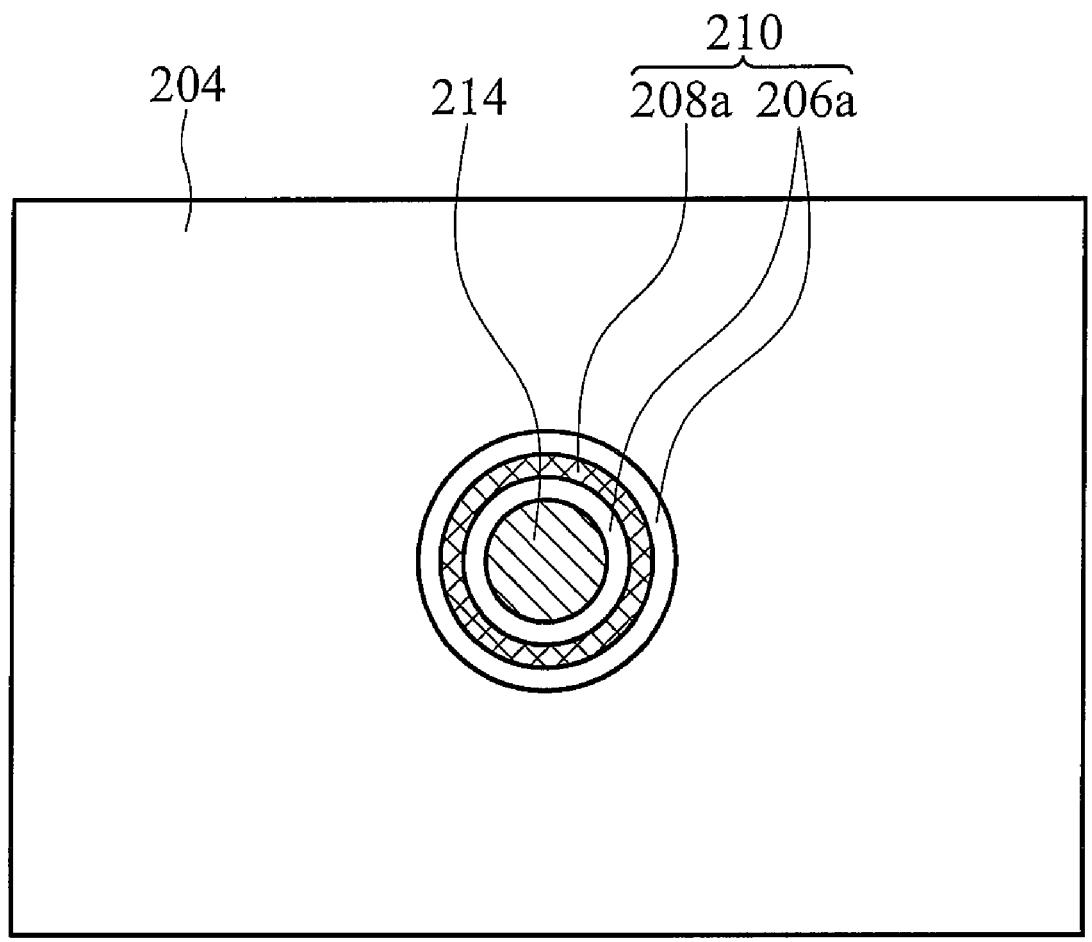
FIG. 4 is a top view of the phase-change memory element of FIG. 3d.

Finally, referring to FIG. 3d, the substrate is etched to remove the dielectric material layers 206 and low thermal conductivity material layers 208 over the top electrode 214 and the substrate 200, exposing the top surface of the top electrode 214 and the substrate 200. FIG. 4 is a top-view of the phase-change memory element according to FIG. 3d. In this step, the dielectric material layers 206 and low thermal conductivity material layers 208 are etched to form a composite layer 210 comprising alternating concentric annular layers of the dielectric material 206a and the low thermal conductivity material 208a surrounding the phase-change material layer 212 and top electrode 214 patterns. Particularly, the dielectric material 206a directly contacts and surrounds the sidewalls of the phase-change material layer 212 and top electrode 214.

Accordingly, the disclosed phase-change memory element allows reduction of both programming current and programming voltage, since the required Joule heating is reduced. Further, since the required programming current density is reduced, reliability is also enhanced. Moreover, the fabrication process is relatively simple and can accommodate various cell designs, and low cost can be maintained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-change memory element, comprising:
   a composite layer comprising a plurality of alternating layers of dielectric material and low thermal conductivity material;
   a via hole within the composite layer; and a phase-change material filled into the via hole and having a vertical side contacting each layer of the alternating layers.

2. The phase-change memory element as claimed in claim 1, wherein the low thermal conductivity material has a thermal conductivity of 0.1 W/m-K to 1 W/m-K.

3. The phase-change memory element as claimed in claim 1, wherein the dielectric material comprises silicon oxide, silicon nitride, or combinations thereof.

4. The phase-change memory element as claimed in claim 1, wherein the low thermal conductivity material comprises phase-change material.

5. The phase-change memory element as claimed in claim 1, wherein the low thermal conductivity material comprises nitrogen-doped phase-change material.

6. The phase-change memory element as claimed in claim 1, wherein the low thermal conductivity material comprises oxygen-doped phase-change material.

7. The phase-change memory element as claimed in claim 1, wherein the thickness of the layers of the dielectric material is at least 3 nm.

8. The phase-change memory element as claimed in claim 1, wherein the thickness of the low thermal conductivity material is at least 3 nm.

9. The phase-change memory element as claimed in claim 1, wherein there is at least one layer of all the dielectric material and the low thermal conductivity material.

10. A phase-change memory element, comprising:
   a composite layer comprising alternating concentric annular layers of dielectric material and low thermal conductivity material;
   a via hole within the composite layer; and
   a phase-change material occupying at least one portion of the via hole,
   wherein the alternating concentric annular layers surround the phase-change material.

11. The phase-change memory element as claimed in claim 10, wherein the dielectric material directly contacts and surrounds the phase-change material.

12. A phase-change memory element, comprising:
   at least one composite layer comprising a mixture of a dielectric material and a low thermal conductivity material;
   a via hole within the composite layer; and
   a phase-change material filling into the via hole.

13. The phase-change memory element as claimed in claim 12, wherein the weight ratio of the composite layer between the dielectric material and the low thermal conductivity material is 1:10~1:1.

14. The phase-change memory element as claimed in claim 12, wherein the low thermal conductivity material has a thermal conductivity of 0.1 W/m-K to 1 W/m-K.

15. The phase-change memory element as claimed in claim 12, wherein the dielectric material comprises silicon oxide, silicon nitride, or combinations thereof.

16. The phase-change memory element as claimed in claim 12, wherein the low thermal conductivity material comprises phase-change material.

17. The phase-change memory element as claimed in claim 12, wherein the low thermal conductivity material comprises nitrogen-doped phase-change material.

18. The phase-change memory element as claimed in claim 12, wherein the low thermal conductivity material comprises oxygen-doped phase-change material.

19. The phase-change memory element as claimed in claim 12, wherein the thickness of the composite layer is at least 3 nm.

20. The phase-change memory element as claimed in claim 12, wherein at least one layer is entirely the low thermal conductivity material.

21. The phase-change memory element as claimed in claim 12, wherein the composite layer is a horizontal composite layer.

* * * * *